United States Patent
Yamanaka et al.

(10) Patent No.: US 7,371,501 B2
(45) Date of Patent: May 13, 2008

(54) PHOTOSENSITIVE RESIN COMPOSITION AND METHOD FOR MANUFACTURING SEMICONDUCTOR APPARATUS USING THE SAME

(75) Inventors: Tsukasa Yamanaka, Haibara-gun (JP); Kenichiro Sato, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/715,883

(22) Filed: Mar. 9, 2007

(65) Prior Publication Data
US 2007/0212899 A1    Sep. 13, 2007

(30) Foreign Application Priority Data
Mar. 9, 2006    (JP)    ............... 2006-064605

(51) Int. Cl.
*G03F 7/023* (2006.01)
*G03F 7/32* (2006.01)

(52) U.S. Cl. .............. 430/191; 430/192; 430/193; 430/326; 430/330

(58) Field of Classification Search ........... 430/191, 430/192, 193, 326, 330
See application file for complete search history.

(56) References Cited

U.S. PATENT DOCUMENTS

| 4,371,685 | A |   | 2/1983 | Ahne et al. |
| 5,318,875 | A | * | 6/1994 | Kawabe et al. ............ 430/191 |
| 6,071,666 | A | * | 6/2000 | Hirano et al. ............. 430/191 |
| 6,235,436 | B1 | * | 5/2001 | Hirano et al. ............. 430/18 |

FOREIGN PATENT DOCUMENTS

| JP | 2002-526795 A | 8/2002 |
| JP | 3346981 B2 | 9/2002 |
| JP | 3478376 B2 | 10/2003 |
| JP | 2005-309032 A | 11/2005 |

* cited by examiner

*Primary Examiner*—John S. Chu
(74) *Attorney, Agent, or Firm*—Sughrue Mion, PLLC

(57) ABSTRACT

A photosensitive resin composition comprises: a polybenzoxazole precursor (A); a naphthoquinone diazide photosensitizer (B); and a specific phenolic hydroxyl group-containing compound (C).

3 Claims, No Drawings

PHOTOSENSITIVE RESIN COMPOSITION AND METHOD FOR MANUFACTURING SEMICONDUCTOR APPARATUS USING THE SAME

BACKGROUND OF THE INVENTION

1. Field of the Invention

The present invention relates to a photosensitive resin composition. More particularly, it relates to a positive type photosensitive resin composition which is suitable for application in the field of microelectronics, and is developable with an alkali aqueous solution, and a method for manufacturing a semiconductor apparatus using the composition.

2. Description of the Related Art

In application of microelectronics, a polymer exhibiting durability at high temperatures is generally widely known. The precursors of such polymers such as polyimide and polybenzoxazole (PBO) can be made photoreactive by a preferable additive. The precursors are converted into desirable polymers by a known technique such as exposure to high temperatures. Therefore, a polymer precursor is used for manufacturing a protective layer, a heat insulating layer, and a relief structure of a highly heat-resistant polymer.

U.S. Pat. No. 4,371,685 discloses a positive type photosensitive composition containing an alkali-soluble PBO precursor, and a diazoquinone photoactive compound. The diazoquinone compound prevents the PBO precursor from being dissolved in a water-based base. After exposure, the diazoquinone compound undergoes photolysis, and is converted into indene carboxylic acid which promotes the dissolution of the PBO precursor into an alkali developer.

Whereas, JP-T-2002-526795 discloses a composition containing a PBO precursor partially capped with a diazoquinone compound.

The photosensitive composition containing such a PBO precursor is a system which is less likely to provide a sufficient difference in dissolution rate between unexposed portions and exposed portions. Thus, there are problems of image performances such as sensitivity, film loss, and resolution.

In Japanese Patent No. 3346981, Japanese Patent No. 3478376, and JP-A-2005-309032, there is disclosed a composition including a polybenzoxazole precursor, a photosensitive quinone diazide compound and a phenol compound. However, the performance balance of sensitivity, the film thickness uniformity in the wafer after development, and the film thickness uniformity after curing was insufficient.

SUMMARY OF THE INVENTION

There are provided a photosensitive resin composition which can manufacture a relief structure having heat resistance, has high sensitivity and undergoes less film loss, and is excellent in the film thickness uniformity in the wafer after development, and the film thickness uniformity after curing, and a method for manufacturing a semiconductor apparatus using the composition.

The objects were attained by the following constitutions:

(1) A photosensitive resin composition comprising: a polybenzoxazole precursor (A); a naphthoquinone diazide photosensitizer (B); and a phenolic hydroxyl group-containing compound (C) represented by general formula (I):

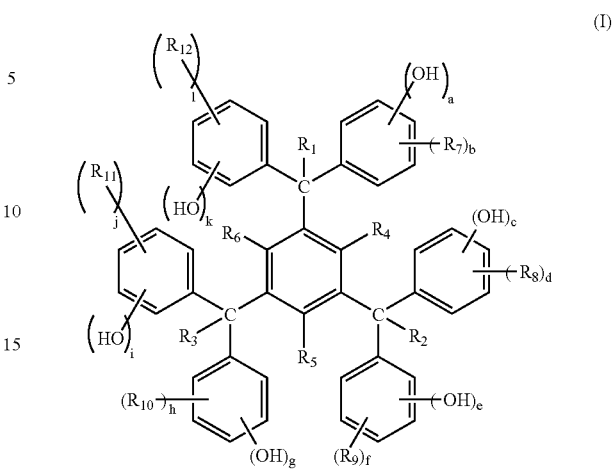

wherein $R_1$ to $R_6$ each independently represents a hydrogen atom, a hydroxyl group, an alkyl group, a cyclic alkyl group, an aryl group, an aralkyl group, an alkoxy group, a halogen atom, an acyl group, an acyloxy group, an alkoxycarbonyl group or an alkenyl group;

$R_7$ to $R_{12}$ each independently represents an alkyl group, a cyclic alkyl group, an aryl group, an aralkyl group, an alkoxy group, a halogen atom, an acyl group, an acyloxy group, an alkoxycarbonyl group, or an alkenyl group;

a plurality of $R_1$ to $R_{12}$ may be each independently different groups;

a, c, e, g, i, and k each independently represents an integer of 0 to 5, and at least one of them is 1 or more; and b, d, f, h, j, and l each independently represents an integer of 0 to 4, and satisfy $a+b \leq 5$, $c+d \leq 5$, $e+f \leq 5$, $g+h \leq 5$, $i+J \leq 5$, and $k+l \leq 5$.

(2) The photosensitive resin composition according to the item (1), the naphthoquinone diazide photosensitizer (B) comprises two or more kinds of naphthoquinone diazide photosensitizers.

(3) A method for manufacturing a semiconductor apparatus characterized by coating the photosensitive resin composition according to the item (1) or (2) on a semiconductor element, and prebaking, exposing, developing and heating it.

DETAILED DESCRIPTION OF THE INVENTION (Polybenzoxazole Precursor (A))

As a polybenzoxazole precursor contained in the photosensitive resin composition of the invention, there can be used the known ones described in U.S. Pat. No. 4,371,685, JP-T-2002-526795, and the like. Examples thereof may include a polybenzoxazole precursor polymer (G) having the following structure:

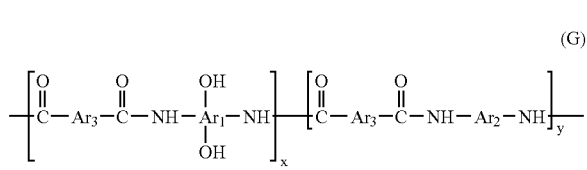

where in the formula, $Ar_1$ is a tetravalent aromatic group, aliphatic group, or heterocyclic group, or a mixed group thereof, $Ar_2$ is a bivalent aromatic group, heterocyclic group, alicyclic group, or aliphatic group, which may contain or may not contain silicon, $Ar_3$ is a bivalent aromatic group, aliphatic group, or heterocyclic group, or a mixed group thereof; and x represents 5 to 1000, and y represents 0 to 900.

The polybenzoxazole precursor generally has a degree of polymerization of 10 to 1000, and it is synthesized by allowing the following monomers (A), (B), and (C) to react in the presence of a base.

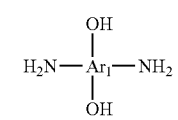
(A)

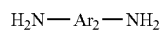
(B)

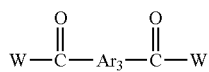
(C)

where in the formula, $Ar_1$, $Ar_2$, $Ar_3$, x, and y are as already defined, W is Cl, OR, or OH, where R is an alkyl group or a cycloalkyl group, such as —$CH_3$, —$C_2H_5$, n-$C_3H_7$, i-$C_3H_7$, n-$C_4H_9$, t-$C_4H_9$, or a cyclohexyl group.

The ratio of [(A)+(B)]/(C) is generally between about 0.9 to 1.1. The monomer (A) is in an amount of about 10 to 100 mol % of [(A)+(B)], and the monomer (B) is in an amount of about 0 to 90 mol % of [(A)+(B)].

Incidentally, the polymer (G) is allowed to react with diazoquinone to produce a polybenzoxazole precursor (F) in which a part of hydroxyl groups are capped by diazoquinone. The resulting product (F) may also be used.

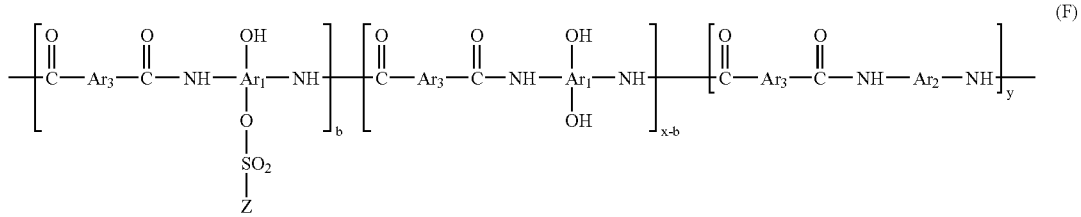
(F)

where in the formula, $Ar_1$, $Ar_2$, and $Ar_3$ are as defined above; x represents 5 to 1000; y represents 0 to 900; and b represents 1 to 50.

Z is a quinone diazide group, examples of which may include the following groups:

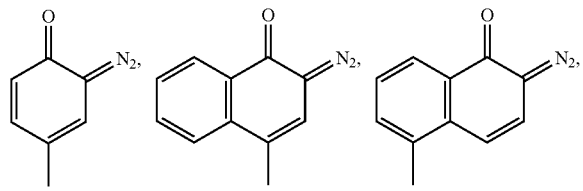

-continued

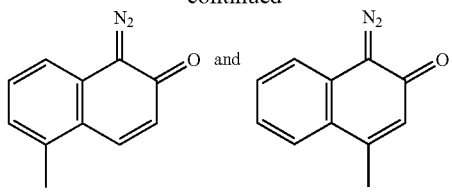

For example, it can be allowed to react with about 1 to 35 mol % of diazoquinone, so that x is 10 to 1000, y is 0 to 900, and b is 0.10 to 350.

Incidentally, in the monomer (A) which is a constituent of the polymers (G) and (F), $Ar_1$ is a tetravalent aromatic group, aliphatic group, or heterocyclic group, examples of which may include the following groups:

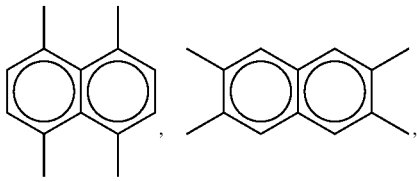

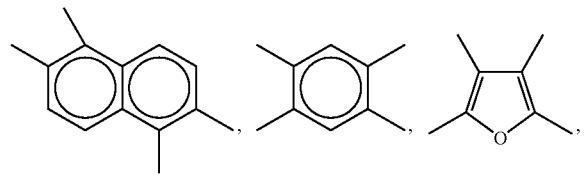

-continued

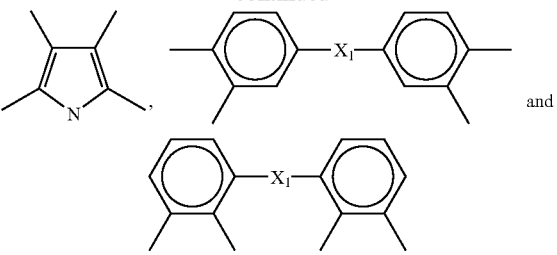

where in the formula, $X_1$ represents —O—, —S—, —C(CF$_3$)$_2$—, —CH$_2$—, —SO$_2$—, —NHCO—, or the following group:

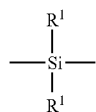

$R^1$ is each independently, an alkyl group or a cycloalkyl group such as —CH$_3$, —C$_2$H$_5$, n-C$_3$H$_7$, i-C$_3$H$_7$, n-C$_4$H$_9$, t-C$_4$H$_9$, or a cyclohexyl group.

Ar$_1$ is not limited to these groups. Further, the monomer (A) may be a mixture of two or more monomers.

In the monomer (B) which is a constituent of the precursor (G) and the capped precursor (F), Ar$_2$ is a bivalent aromatic group, heterocyclic group, alicyclic group, or aliphatic group which may contain or may not contain silicon.

Non-limiting examples of the monomer (B) containing Ar$_2$ may include: 5(6)-diamino-1-(4-aminophenyl)-1,3,3-trimethyl indane (DAPI), m-phenylene diamine, p-phenylene diamine 2,2'-bis(trifluoromethyl)-4,4'-diamino-1,1'-biphenyl, 3,4'-diamino diphenyl ether, 4,4'-diamino diphenyl ether, 3,3'-diamino diphenyl ether, 2,4-tolylene diamine, 3,3'-diamino diphenyl sulfone, 3,4'-diamino diphenyl sulfone, 4,4'-diamino diphenyl sulfone, 3,3'-diamino diphenylmethane, 4,4'-diamino diphenylmethane, 3,4'-diamino diphenylmethane, 4,4'-diamino diphenyl ketone, 3,3'-diamino diphenyl ketone, 3,4'-diamino diphenyl ketone, 1,3-bis(4-amino phenoxy)benzene, 1,3-bis(3-amino-phenoxy)benzene, 1,4-bis(γ-amino propyl)tetramethyl disiloxane, 2,3,5,6-tetramethyl-p-phenylene diamine, m-xylylene diamine, p-xylylene diamine, methylene diamine, tetramethylene diamine, pentamethylene diamine, hexamethylene diamine, 2,5-dimethyl hexamethylene diamine, 3-methoxy hexamethylene diamine, heptamethylene diamine, 2,5-dimethyl heptamethylene diamine, 3-methyl heptamethylene diamine, 4,4-dimethyl heptamethylene diamine, octamethylene diamine, nonamethylene diamine, 2,5-dimethyl nonamethylene diamine, decamethylene diamine, ethylenediamine, propylene diamine, 2,2-dimethyl propylene diamine, 1,10-diamino-1,10-dimethyl decane, 2,11-diamino dodecane, 1,12-diamino octadecane, 2,17-diamino eicosane, 3,3'-dimethyl-4,4'-diamino diphenylmethane, bis(4-amino cyclohexyl)methane, 3,3'-diamino diphenyl ethane, 4,4'-diamino diphenyl ethane, 4,4'-diamino diphenyl sulfide, 2,6-diamino pyridine, 2,5-diamino pyridine, 2,6-diamino-4-trifluoromethyl pyridine, 2,5-diamino-1,3,4-oxadiazole, 1,4-diamino cyclohexane, piperazine, 4,4'-methylene dianiline, 4,4'-methylene di-bis(o-chloroaniline), 4,4'-methylene-bis(3-methyl aniline), 4,4'-methylene-bis(2-ethyl aniline), 4,4'-methylene-bis(2-methoxy aniline), 4,4'-oxy-dianiline, 4,41-oxy-bis-(2-methoxy aniline), 4,4'-oxy-bis-(2-cloroaniline), 4,4'-thio-dianiline, 4,4'-thio-bis-(2-methyl aniline), 4,4'-thio-bis-(2-methoxy aniline), 4,4'-thio-bis-(2-chloroaniline), 3,3'-sulfonyl-dianiline, and 3,3'-sulfonyl-dianiline, and mixtures thereof. However, it should be understood that the monomer (B) is not limited thereto.

In the monomer (C) which is the constituent of the polybenzoxazole precursor (G) and the capped precursor (F), Ar$_3$ is a bivalent aromatic group, aliphatic group, or heterocyclic group, examples of which may include the following groups:

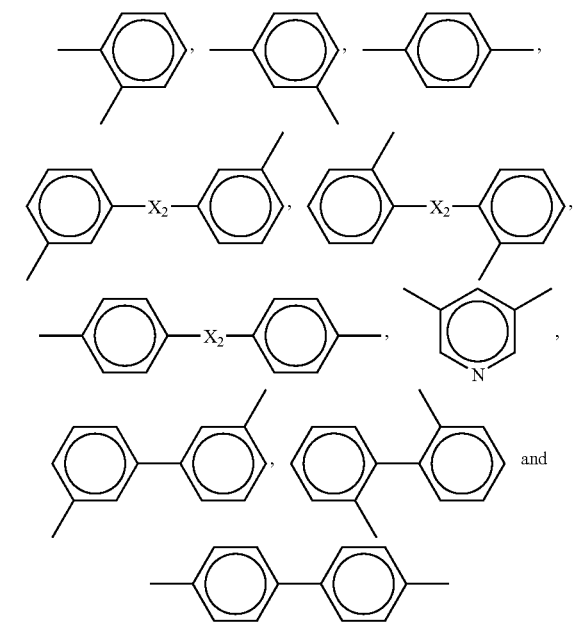

(where in the formula, X$_2$ is —O—, —S—, —C(CF$_3$)$_2$—, —CH$_2$—, —SO$_2$—, or —NHCO—.)

Ar$_3$ is not limited to these groups. Further, the monomer (C) may be a mixture of two or more monomers.

Examples of the diazoquinone compound to be allowed to react with the PBO precursor (G) may include the following ones, which may be used in plurality.

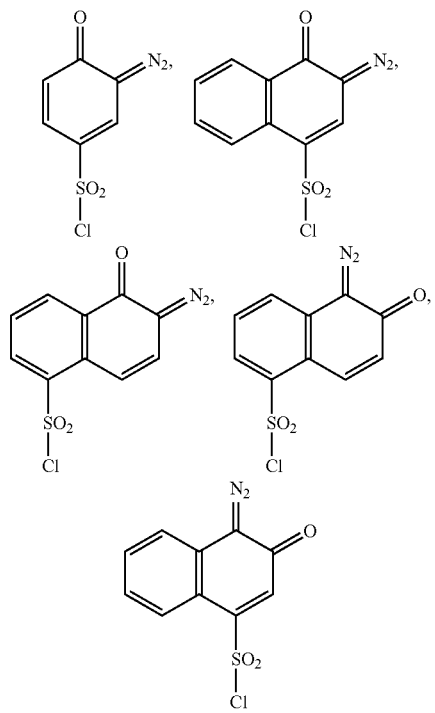

Preferred reaction solvents are N-methyl-2-pyrrolidone (NMP), γ-butyrolactone (GBL), N,N-dimethylformamide (DMF), N,N-dimethylacetamide (DMAc), dimethyl-2-piperidone, dimethylsulfoxide (DMSO), sulfolane, and diglyme. Most preferred solvents are N-methyl-2-pyrrolidone (NMP) and γ-butyrolactone (GBL). In order to allow a dicarboxylic acid or a chloride thereof or an ester thereof to react with at least one aromatic and/or heterocyclic dihydroxy diamine, and if required, at least one diamine, a commonly used given reaction may be used. Preferred examples of the dicarboxylic acid is selected from a group consisting of 4,4'-diphenyl ether dicarboxylic acid, terephthalic acid, and isophthalic acid, and mixtures thereof. Preferred examples of the dihydroxy diamine compound are 3,3'-dihydroxy-4,4'-diamino diphenyl ether, 3,3'-dihydroxy benzidine, hexafluoro-2,2-bis-3-amino-4-hydroxyphenyl propane, and mixtures thereof. The reaction is generally carried out at about −10 to about 30° C. for about 6 to 48 hours. The molar ratio of dicarboxylic acid and (diamine+dihydroxy diamine) is about 0.9 to 1.1:1.

The capped PBO precursor can be produced in accordance with the following reaction:

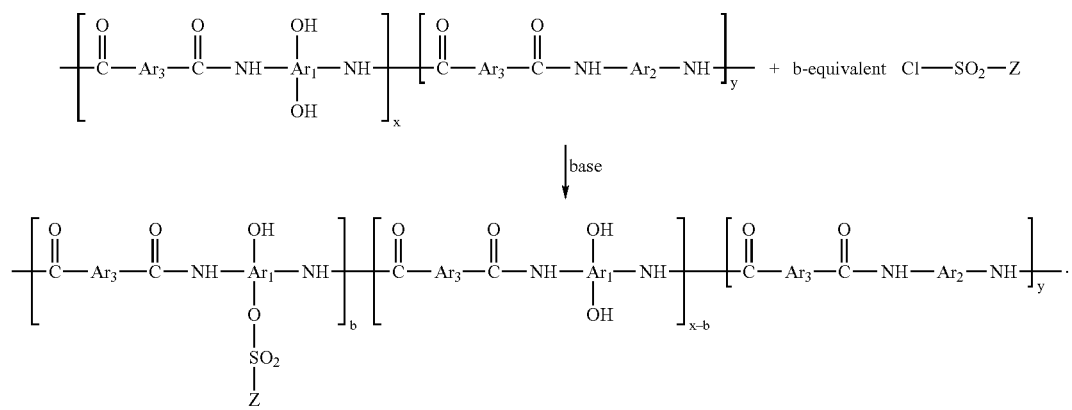

(where in the formula, Z is as already defined.)

There may be used a preferable given method for allowing polybenzoxazole to react with the photoactive moiety Cl—SO$_2$-Z. Generally, the reaction is carried out at about 0 to about 30° C. for about 3 to 24 hours in the presence of a base such as pyridine, trialkylamine, methyl pyridine, lutidine, or n-methylmorpholine. The most preferred base is triethylamine.

The b/x ratio is generally 0.01 to 0.35, preferably 0.02 to 0.20, and most preferably 0.03 to 0.05.

The amount of the polybenzoxazole precursor to be added is generally 50 to 99 mass %, and preferably 60 to 95 mass % based on the total solid content of the photosensitive resin composition of the invention (the total amount of components forming the finally obtained cured product excluding the solvent). (Naphthoquinone diazide photosensitizer (B))

As the naphthoquinone diazide photosensitizer, mention may be made of a quinone diazide sulfonic acid ester of a phenol compound.

Examples of a quinone diazide sulfonic acid ester of a phenol compound include one having the following structure:

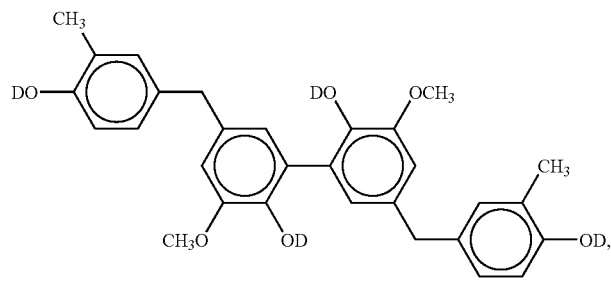

-continued
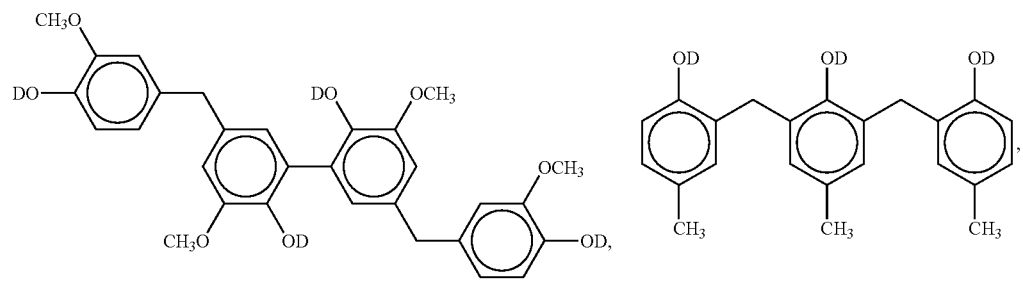
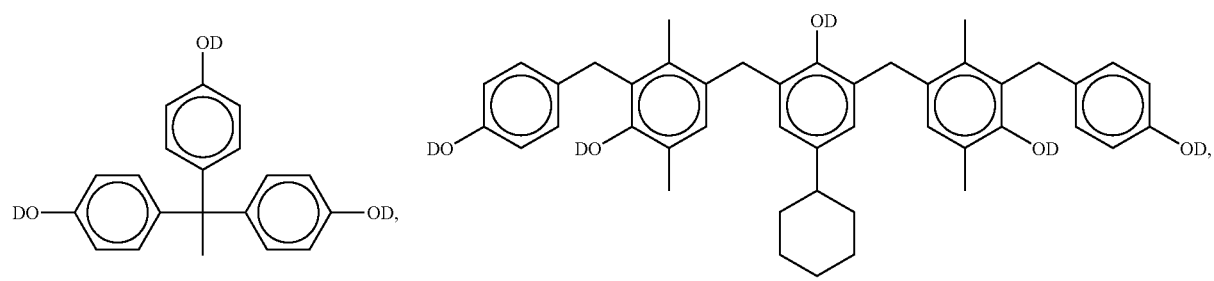
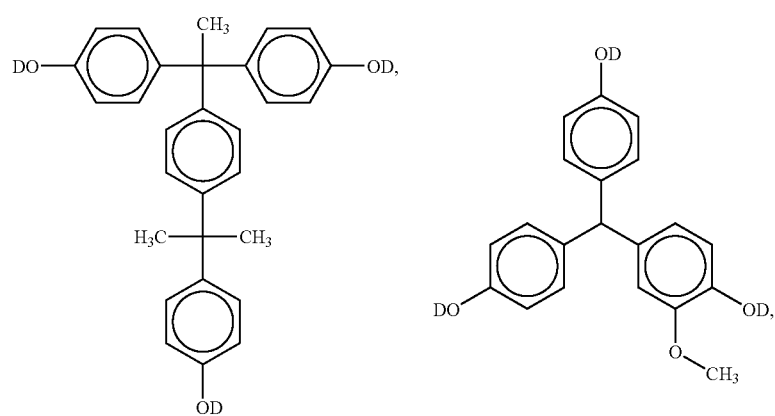
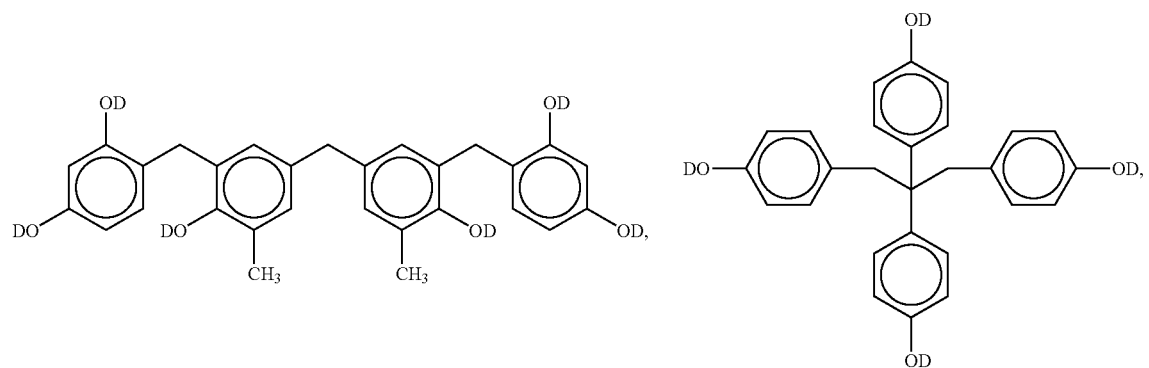
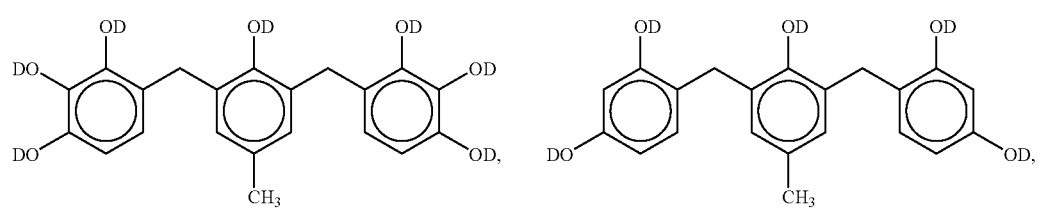

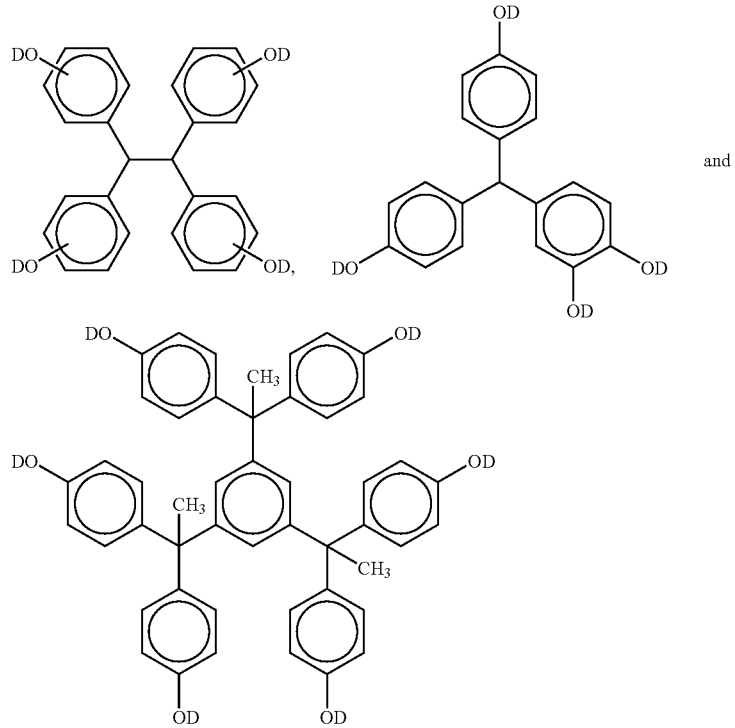

-continued and (where in the formula, D is independently H or any of the following groups.)

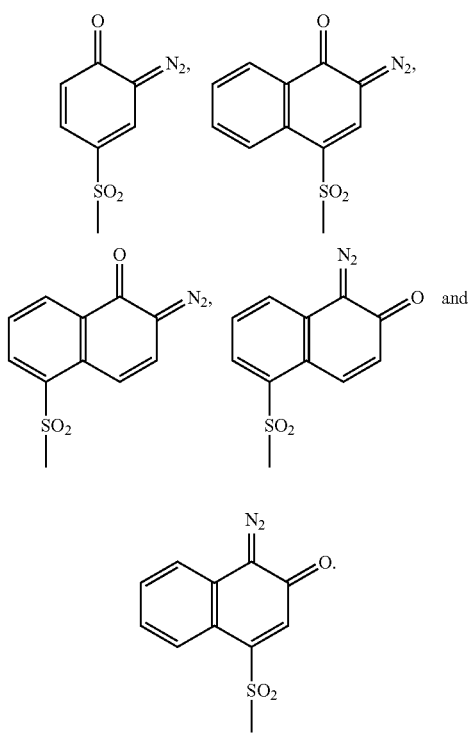

However, at least one D in respective compounds is a quinone diazide group.

These compounds are not exclusive.

The amount of the photosensitizer to be added is generally 1 to 50 mass %, and preferably 5 to 40 mass % on the total solid content of the photosensitive resin composition of the invention (the total amount of components forming the finally obtained cured product excluding the solvent). It is further effective to use two or more of the photosensitizers in mixture.

In combination with the naphthoquinone diazide photosensitizer, other photosensitizers such as a dihydropyridine compound (I) may be used.

The amount of such a photosensitizer which may be used in combination to be added is generally 50 mass % or less, and preferably 30 mass % or less based on the amount of the naphthoquinone diazide photosensitizer.

Examples of the dihydropyridine (I) may include the compound having the following structure:

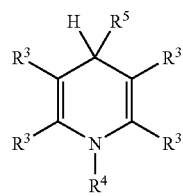

where in the formula, $R^3$ groups are the same or different, and have the following structure: H, OH, COO—$(CH_2)_n$—$CH_3$, $(CH_2)_n$—$CH_3$, O—$(CH_2)_n$—$CH_3$, CO—$(CH_2)_n$—$CH_3$, $(CF_2)_n$—$CF_3$, $C_6H_5$, COOH, $(CH_2)_n$—O—$(CH_2)_m$—$CH_3$, $(CH_2)_n$—OH, $CH_2$=CH—$(CH_2)_p$—CO—$CH_2$, F, Cl, Br, or I, where m=0 to 10, n=0 to 10, and p=0 to 4;

R⁴ is H, $C_1$ to $C_7$ alkyl, cycloalkyl, or phenyl, and monosubstituted phenyl; and R⁵ is any of the following groups:

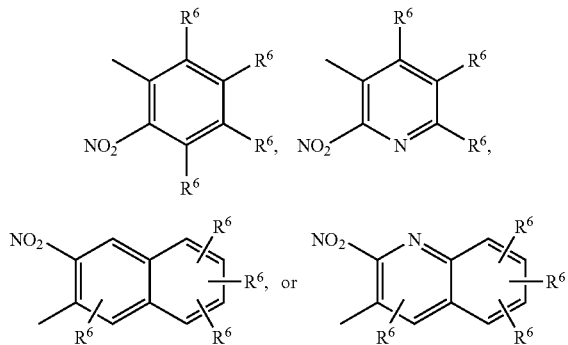

where in the formula, R⁶ is defined similarly as R³, and a $NO_2$ group is at the ortho position with respect to the dihydropyridine ring.

Examples of the dihydropyridine may include the following:

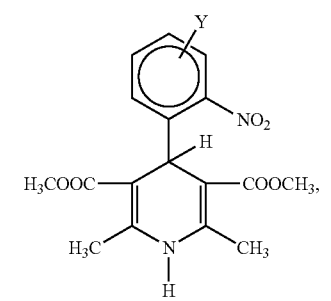

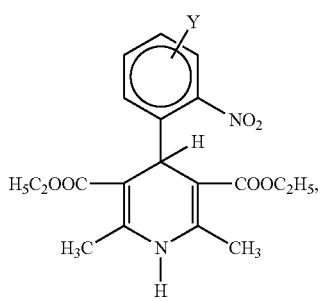

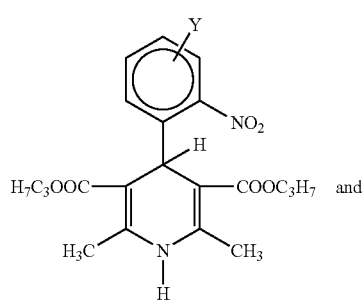

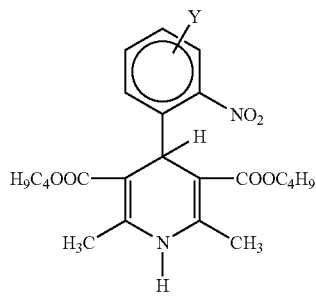

(where in the formula, Y is —OR², where R² is a substituted or unsubstituted monovalent aromatic or aliphatic group, CN, Cl, Br, or I)

(Phenolic Hydroxyl Group-Containing Compound (C))

The phenolic hydroxyl group-containing compound contained in the photosensitive resin composition of the invention is a compound represented by the general formula (I) (which is also hereinafter referred to as a compound (C)).

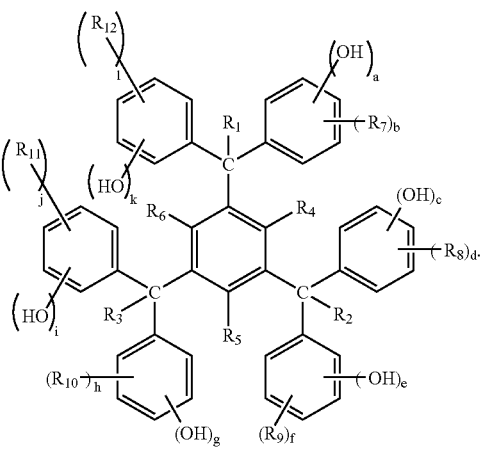

(I)

$R_1$ to $R_6$ each independently represent a hydrogen atom, a hydroxyl group, an alkyl group, a cyclic alkyl group, an aryl group, an aralkyl group, an alkoxy group, a halogen atom, an acyl group, an acyloxy group, an alkoxycarbonyl group, or an alkenyl group.

$R_7$ to $R_{12}$ each independently represent an alkyl group, a cyclic alkyl group, an aryl group, an aralkyl group, an alkoxy group, a halogen atom, an acyl group, an acyloxy group, an alkoxycarbonyl group, or an alkenyl group.

A plurality of $R_1$ to $R_{12}$ may be each independently a different group.

a, c, e, g, i, and k each independently represent an integer of 0 to 5, and one of them is at least 1 or more.

b, d, f, h, j, and l each independently represent an integer of 0 to 4, and $a+b \leq 5$, $c+d \leq 5$, $e+f \leq 5$, $g+h \leq 5$, $i+j \leq 5$, and $k+l \leq 5$.

At least one of a, c, e, g, and i is 1 or more. Further, in terms of enhancement of sensitivity, in particular preferably $a+c+e+g+i+k \geq 3$, and further preferably $6 \geq a+c+e+g+i+k \geq 4$.

$b+d+f+h+j+l$ is preferably 12 or less.

The number of carbons of the substituents as $R_1$ to $R_{12}$ is preferably 12 or less, and more preferably 6 or less.

$R_1$ to $R_6$ are each preferably a hydrogen atom, a hydroxyl group, an alkyl group, a cyclic alkyl group, an aryl group, an aralkyl group, an alkoxy group, an acyl group, an acyloxy group, an alkoxycarbonyl group, or an alkenyl group, having 12 or less carbon atoms, and more preferably 6 or less carbon atoms, or a halogen atom.

The number of the phenolic hydroxyl groups possessed by the compound (C) is preferably 3 or more, more preferably 4 or more, and in particular preferably 4 to 6.

As the compound (C), a commercially available product may be used. Alternatively, it may be synthesized by a known method.

The amount of the compound (C) to be added is preferably 0.5 mass % to 40 mass %, further preferably 2 mass % or more to 20 mass % based on the total solid content excluding the solvent (the total amount of components forming the finally obtained cured product excluding the solvent).

Non-limiting specific examples of the compound (C) may include the following:

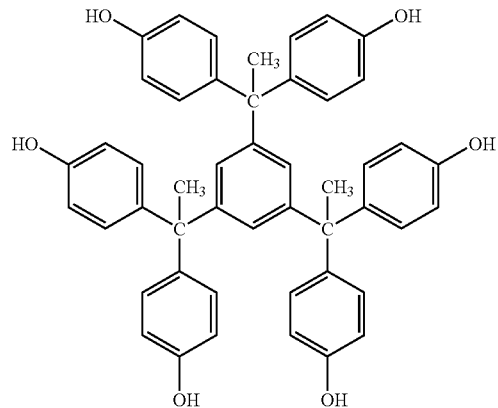

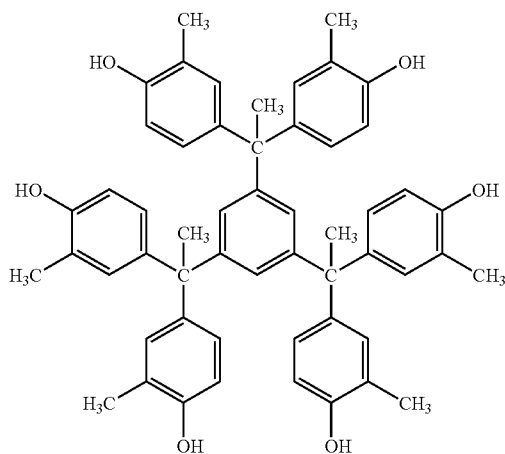

-continued

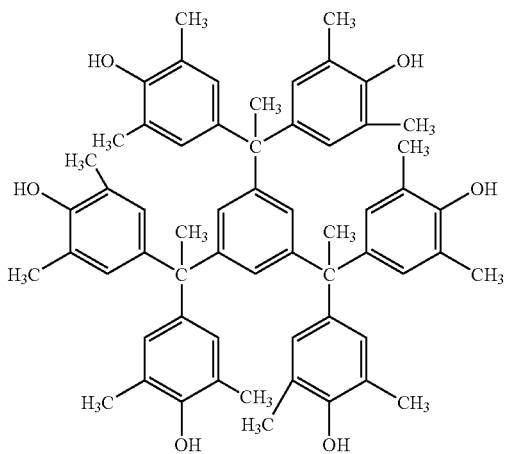

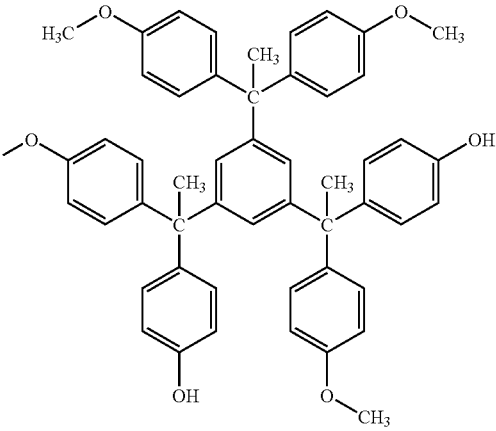

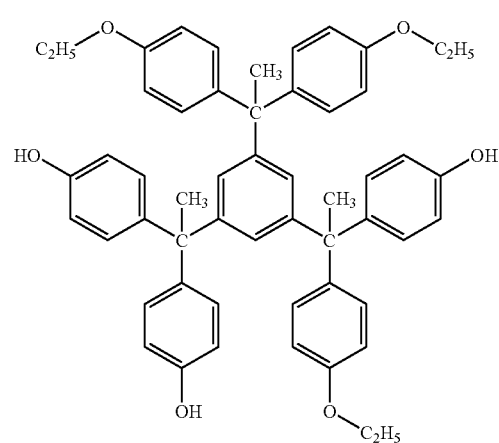

-continued

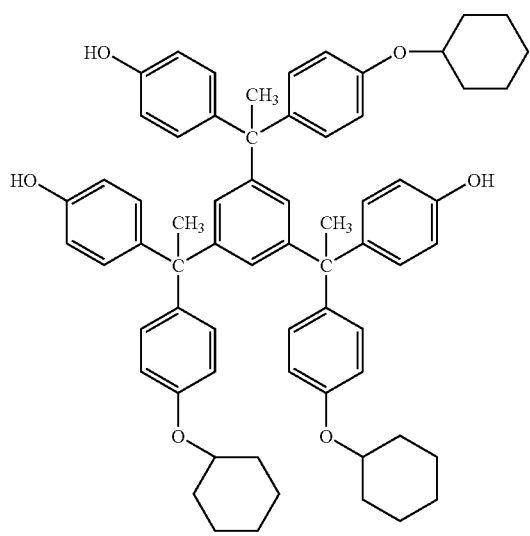

Further, use of other phenolic hydroxyl group-containing compounds in combination improves the effect. The amount of the phenolic hydroxyl group-containing compound, which is used in combination, and mixed, to be added is 1 part by mass to 100 parts by mass, and in particular preferably 5 parts by mass to 50 parts by mass per 100 parts by mass of the compound of the invention.

(Solvent)

The photosensitive resin composition of the invention is preferably used in the form of a solution of at least a photosensitizer and a PBO precursor dissolved in a solvent.

Non-limiting preferred solvents include organic solvents such as N-methyl pyrrolidone (NMP), γ-butyrolactone (GBL), N,N-dimethylacetamide (DMAc), dimethyl-2-piperidone, N,N-dimethylformamide (DMF), propylene glycol monomethyl ether acetate, propylene glycol monomethyl ether, ethyl lactate, ethyl ethoxy propionate, and propylene carbonate, and mixtures thereof.

More preferred solvents are γ-butyrolactone, N-methyl pyrrolidone, propylene glycol monomethyl ether acetate, propylene glycol monomethyl ether, ethyl lactate, ethyl ethoxy propionate, and propylene carbonate. As particularly preferred solvents, mention may be made of γ-butyrolactone, propylene glycol monomethyl ether acetate, ethyl lactate, and propylene carbonate, and mixed solvents of two or more of the solvents mentioned as the more preferred solvents.

(Adhesion Promoter)

The photosensitive resin composition of the invention may contain an adhesion promoter. Preferred examples of the adhesion promoter may include dianhydride/DAPI/bis(3-aminopropyl)tetramethyl siloxane (BATS) polyamic acid copolymer, and aminosilane, and mixtures thereof. Addition of dianhydride/DAPI/BATS polyamic acid copolymer increases the adhesion characteristics.

The dianhydride/DAPI/BATS polyamic acid copolymer can be synthesized in a reaction solvent by the reaction of tetracarboxylic acid dianhydride (J), BATS diamine and DAPI diamine according to the following reaction:

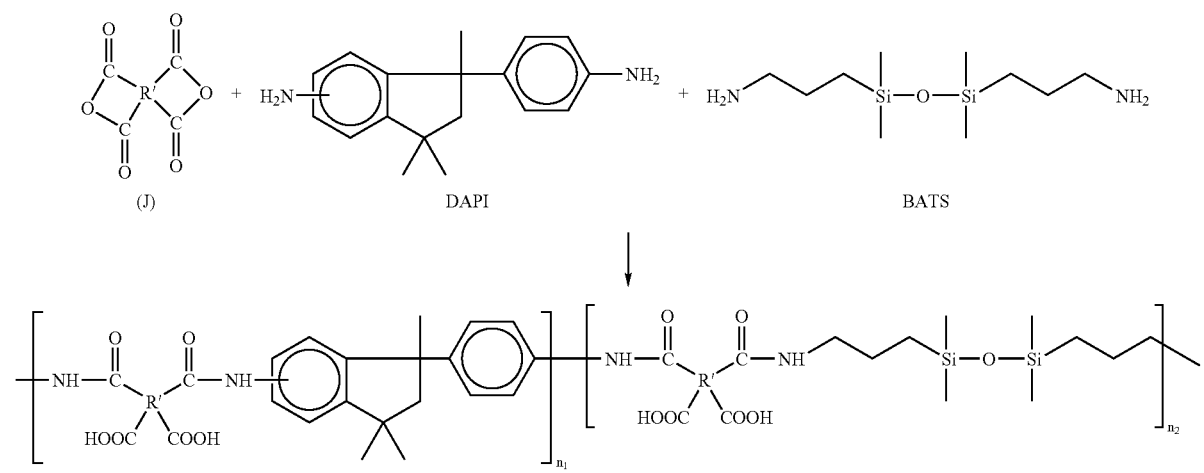

(where in the formula, R' is a tetravalent group.)

The tetracarboxylic acid dianhydrides (J) may be, but is not limited to pyromellitic acid dianhydride (PMDA), 3,3'4, 4'-benzophenone tetracarboxylic acid dianhydride, 3,3',4,4'-biphenyl tetracarboxylic acid dianhydride, 3,3',4,4'-diphenyl sulfone tetracarboxylic acid dianhydride, 4,4'-perfluoroisopropylidine diphthalic acid dianhydride, 4,4'-oxydiphthalic acid anhydride, bis(3,4-dicarboxyl)tetramethyl disiloxane dianhydride, bis(3,4-dicarboxylphenyl)dimethylsilane dianhydride, butane tetracarboxylic acid dianhydride, and 1,4,5,8-naphthalene tetracarboxylic acid dianhydride, and mixtures thereof.

The molar ratio of DAPI/BATS is about 0.1/99.9 to 99.9/0.1. The preferred molar ratio is about 10/90 to 40/60, and the most preferred molar ratio is about 15/85 to 30/70.

The preferred reaction solvents are N-methyl-2-pyrrolidinone (NMP), γ-butyrolactone (GBL), N,N-dimethylformamide (DMP), N,N-dimethylacetamide (DMAC), dimethylsulfoxide (DMSO), sulfolane and diglyme. The most preferred reaction solvents are N-methyl-2-pyrrolidinone (NMP), and γ-butyrolactone (GBL).

In order to allow dianhydrides to react with the two diamines, a preferred given reaction may be used. Generally, the reaction is carried out at about 10 to about 50° C. for about 6 to 48 hours. The molar ratio of dianhydrides and diamines should be about 0.9 to 1.1:1.

The photosensitive resin composition of the invention can further contain other additives such as a levelling agent.

By the use of the photosensitive resin composition of the invention, a relief pattern can be formed in the following manner: (a) the photosensitive resin composition of the invention is coated on a proper substrate; (b) the coated substrate is baked; (c) the baked substrate is exposed to an active ray or radiation; (d) development is carried out with an aqueous developer; and (E) curing is carried out. As a result, a cured relief pattern can be formed.

The coated and exposed substrate can also be baked at high temperatures prior to development. Alternatively, the developed substrate may be, before curing, rinsed and baked for the purpose of drying the rinse.

Thus, with the photosensitive resin composition of the invention, coating is carried out on a semiconductor element such that the thickness after heating and curing becomes a prescribed thickness (e.g., 0.1 to 30 μm), followed by prebaking, exposure, development, and heating and curing. This can manufacture a semiconductor apparatus.

Below, the method for forming a relief pattern will be described in details.

The photosensitive resin composition of the invention is coated on a preferable substrate. Examples of the substrate include semiconductor materials such as a silicon wafer or ceramic base materials, glass, metal, or plastic. The coating methods include, but are not limited to spray coating, spin coating, offset printing, roller coating, screen printing, extrusion coating, meniscus coating, curtain coating, and dip coating.

The substrate is preferably subjected to a treatment for removing trace amounts of impurities on the substrate surface in order to improve the adhesion with the following coating film. The treatment methods for removing trace amounts of impurities include a baking treatment and washing with a chemical solution.

the coating film is prebaked at an elevated temperature of about 70 to 120° C. for several minutes to half hour according to the method in order to vaporize the remaining solvent. Subsequently, the resulting dry film is exposed to an active ray or radiation in a preferable pattern through a mask. As the active ray or radiation, an X ray, an electron beam, an ultraviolet ray, a visible light, or the like is usable. The most preferable radiations are the ones having wavelengths of 436 nm (g-line) and 365 nm (i-line).

It is advantageous to heat the coated and exposed substrate to a temperature of about 70 to 120° C. following the exposure to an active ray or radiation. The coated and exposed substrate is heated within this temperature range for a short time, generally for several seconds to several minutes. This stage of this method is commonly referred to as post-exposure baking from the viewpoint of technology.

Then, the coating film is developed with an aqueous developer, and a relief pattern is formed. Aqueous developers include alkali solutions such as inorganic alkalis (e.g., potassium hydroxide, sodium hydroxide, and aqueous ammonia), primary amines (e.g., ethylamine, and n-propylamine), secondary amines (e.g., diethylamine, and di-n-propylamine), tertiary amines (e.g., triethylamine), alcohol amines (e.g., triethanol amine), and quaternary ammonium salts (e.g., tetramethyl ammonium hydroxide, tetraethyl ammonium hydroxide), and mixtures thereof. The most preferred developer is the one containing tetramethyl ammonium hydroxide. In addition, a proper amount of a surfactant may be added to the developer. Development can be carried out by dipping, spraying, puddling, or other similar development methods.

If required, the relief patterns is then rinsed by the use, of deionized water. Then, in order to obtain a final pattern of a polymer with a high heat resistance, the relief pattern is cured, thereby to form an oxazole ring. Curing is carried out by baking the substrate at the glass transition temperature Tg of the polymer so as to an oxazole ring which forms the final pattern with a high heat resistance. Generally, a temperature of more than about 200° C. is used. It is preferable to use a temperature of about 250 to 400° C.

EXAMPLES

Below, the invention will be described in more details based on Examples. However, the invention is not limited thereto.

[Synthesis of Compound (C)]

Synthetic Example 1

Triacetylbenzene, and 60 molar equivalents of phenol and 10 molar equivalents of methane sulfonic acid, and 0.3 molar equivalent of mercapto acetic acid based on the amount of triacetylbenzene were mixed, and heated and stirred at 70° C. for 7 hours. After the completion of heating, the mixture was allowed to cool to room temperature. Then, the reaction solution was diluted with methanol to a two-fold amount. The diluted reaction solution was charged into a 10-fold amount of distilled water, thereby to precipitate a mixture containing the objective substance. This was purified with silica gel column chromatography to obtain an objective compound (A-1). The yield was 80%.

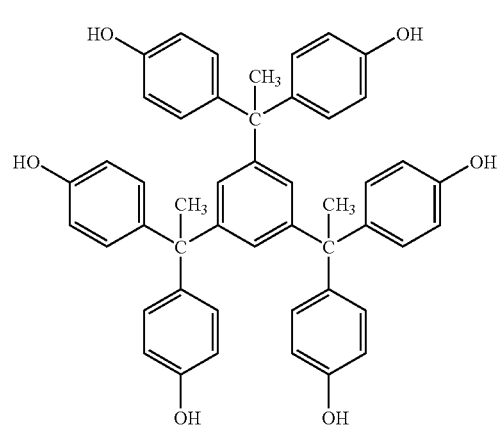

(A-1)

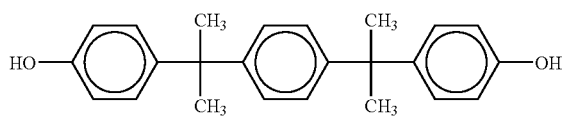

(b1)

<Synthesis of Quinone Diazide Sulfonic Acid Esters (B2) and (B3)>

The naphthoquinone diazide compounds (B2) and (B3) for use in Examples were synthesized in the same manner as with the foregoing method, except that the phenol compound corresponding to the foregoing (b1) was replaced with the following ones (b2) and (b3), respectively.

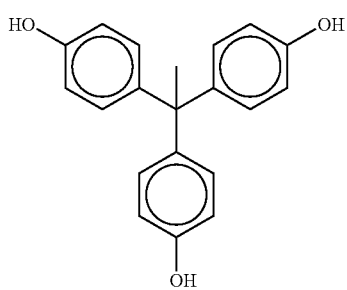

(b2)

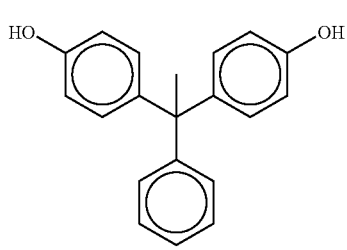

(b3)

Synthetic Example 2

One mol of the compound (A-1) of Synthetic Example 1 was allowed to react with 0.35 mol of methyl chloride. The resulting product was purified with silica gel column chromatography to obtain a compound (B-1) resulting from methylation of a part (33 mol % on an average) of the hydroxyl groups of the compound (A-1)

[Synthesis of Photosensitizer]

<Synthesis of Quinone Diazide Sulfonic Acid Ester (B1) of Phenol Compound (b1)>

To a three-necked flask, 17.3 g of a phenol compound (b1) and 200 mL of 1,4-dioxane were added, and dissolved until the mixture became homogeneous. Then, 13.4 g of 1,2-naphthoquinone diazide-4-sulfonyl chloride was added and dissolved. The reaction vessel was cooled to 10° C. with ice water. Then, 5.6 g of triethylamine was added dropwise over 1 hour. After the completion of dropwise addition, stirring was carried out for 12 hours. Then, 13.4 g of 1,2-naphthoquinone diazide-5-sulfonyl chloride was added and dissolved. The reaction vessel was cooled to 10° C. with ice water. Then, 5.6 g of triethylamine was added dropwise over 1 hour. After the completion of dropwise addition, stirring was carried out for 4 hours. After the completion of the reaction, distilled water was added to dissolve the precipitated salt. Stirring was carried out for 30 minutes, and the mixture was neutralized with diluted hydrochloric acid. Then, crystallization was effected in 1 L of distilled water. The precipitated deep yellow powder was collected by filtration. The filtrate was dissolved in 200 mL of dioxane again, and this was crystallized in 1 L of distilled water. The precipitated filtrate was filtrated. The filtrate was washed with 1 L of distilled water, and filtrated to recover 32.2 g of the objective substance (B1) which was a deep yellow powder. The resulting (B1) was analyzed by high performance liquid chromatograph (S1525 manufactured by WATERS Co.). As a result, the purity of the esterified product of the phenol compound (b1) was found to be 98% (detection wavelength 254 nm).

[Synthesis of PBO Precursor Resin]

<Synthesis of Resin A-1>

To a 100-ml three-necked flask, 3.85 g (10.5 mmol) of hexafluoro-2,2-bis(3-amino-4-hydroxyphenyl)propane, 1.70 g (21 mmol) of pyridine, and 15 g of N-methyl-2-pyrrolidone (NMP) were added. The solution was stirred at room temperature until all the solids dissolved, and then, cooled to 0 to 5° C. in an ice bath. To this solution, 1.02 g (5 mmol) of isophthaloyl chloride, and 1.48 g (5 mmol) of 1,4-oxydibenzoyl chloride dissolved in 10 g of NMP were added dropwise. After the completion of addition, the resulting mixture was stirred at room temperature for 18 hours. In a 800 ml of vigorously stirred deionized water, a viscous solution was charged. The precipitated white powder was recovered by filtration, and washed with deionized water and a water/methanol (50/50) mixture. Under vacuum, the polymer was dried at 40° C. for 24 hours to obtain a resin A-1 which was the objective substance. The yield was almost quantitative. Whereas, the intrinsic viscosity of the resin A-1 was measured in NMP at a concentration of 0.5 g/dL at 25° C., and found to be 0.28 dL/g.

<Synthesis of Resin A-2>

To a 100-ml three-necked flask, 3.85 g (10.5 mmol) of hexafluoro-2,2-bis(3-amino-4-hydroxyphenyl)propane, 1.70 g (21 mmol) of pyridine, and 15 g of N-methyl-2-pyrrolidone (NMP) were added. The solution was stirred at room temperature until all the solids dissolved, and then, cooled to 0 to 5° C. in an ice bath. To this solution, 0.41 g (2 mmol) of isophthaloyl chloride, and 2.36 g (8 mmol) of 1,4-oxydibenzoyl chloride dissolved in 10 g of NMP were added dropwise. After the completion of addition, the resulting mixture was stirred at room temperature for 18 hours. In a 800 ml of vigorously stirred deionized water, a viscous solution was charged. The precipitated white powder was recovered by filtration, and washed with deionized water and a water/methanol (50/50) mixture. Under vacuum, the polymer was dried at 40° C. for 24 hours to obtain a resin A-2 which was the objective substance. The yield was almost quantitative. Whereas, the intrinsic viscosity of the resin A-2 was measured in NMP at a concentration of 0.5 g/dL at 25° C., and found to be 0.26 dL/g.

<Synthesis of Resin A-3>

5.42 g (10.0 mmol) of the polymer of the resin A-1 obtained above, and 50 ml of tetrahydrofuran (THF) were added. The mixture was stirred for 10 minutes, and the solids were completely dissolved. Then, 0.54 g (2 mmol) of 1,2-naphthoquinone diazide-5-sulfonyl chloride was added, and the mixture was further stirred for 10 minutes. 0.20 g (2 mmol) of triethylamine was gradually added over 30 minutes, and then, the reaction mixture was stirred for 5 hours. Then, to 500 ml of vigorously stirred deionized water, the reaction mixture was gradually added. The precipitated product was separated by filtration, and washed with 200 ml of deionized water. To the product, further, 600 ml of deionized water was added, and the mixture was vigorously stirred for 30 minutes. After filtration, the product was washed with 100 ml of deionized water. The isolated product was dried at 40° C. overnight. The yield was 90%.

<Synthesis of Resin A-4>

The resin A-4 was synthesized in the same manner as with the resin A-3 by using the resin A-2 as a raw material.

[Preparation of Photosensitive Resin Composition]

The resin, the photosensitizer, and the phenolic hydroxyl group-containing compound described in Table 1, and 2 g of the following adhesion promoter C (alkoxysilane compound) were dissolved in γ-butyrolactone to form a solution with a solid content concentration of 40 mass %. Then, the solution was filtrated through a cassette type filter made of tetrafluoroethylene (0.2 μm) to prepare a photosensitive resin composition.

Adhesion promoter C

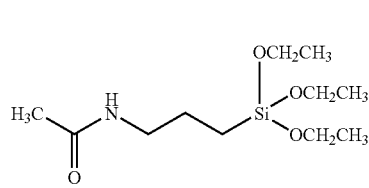

<Residual Film Ratio Evaluation>

The prepared composition was spin coated on a silicon wafer, and baked on a hot plate at 120° C. for 4 minutes, resulting in a film with a thickness of 8 μm. The film was exposed to light by the use of an i-line stepper, and by the use of a mask of 100-micron via hole repeating pattern. Then, it was developed by the use of a 0.262 N TMAH aqueous solution, and subsequently, rinsed with deionized water.

The exposure dose for reproducing 100-micron via holes is assumed to be the optimum exposure dose. Thus, with the exposure dose, exposure and development were carried out to obtain a pattern. The film thickness (FT1) of the unexposed portions upon obtaining the pattern was measured, and the residual film ratio was defined as follows:

Residual film ratio=100×$FT1$ (μm)/8 μm

<Evaluation of In-Plane Uniformity of Film Thickness After Development>

The film thickness on the wafer after development was measured at 50 points. Thus, the case where the standard deviation is 0.5 μm or less is referred to as A. The case where the standard deviation is larger than that is referred to as C.

<Evaluation of In-Plane Uniformity of the Film Thickness After Curing>

The film thickness on the wafer after development was measured at 50 points. Thus, the case where the standard deviation is 1.0 μm or less is referred to as A. The case where the standard deviation is larger than that is referred to as C.

TABLE 1

| Example | Resin | Naphthoquinone diazide photosensitizer | Phenolic hydroxyl group-containing compound |
|---|---|---|---|
| Example 1 | Resin A-1 (100 g) | b1 (20 g) | A-1 (5 g) |
| Example 2 | Resin A-2 (100 g) | b1 (22 g) | A-1 (10 g) |
| Example 3 | Resin A-3 (100 g) | b3 (15 g) | A-1 (7 g) |
| Example 4 | Resin A-4 (100 g) | b1 (15 g) | B-1 (15 g) |
| Example 5 | Resin A-1 (100 g) | b2 (20 g) | B-1 (10 g) |
| Example 6 | Resin A-2 (50 g) | b1 (7 g) | B-1 (7 g) |
|  | Resin A-3 (50 g) | b2 (7 g) | C-1 (3 g) |
| Comparative Example 1 | Resin A-1 (100 g) | b3 (22 g) | No addition |
| Comparative Example 2 | Resin A-3 (100 g) | b3 (20 g) | No addition |

C-1

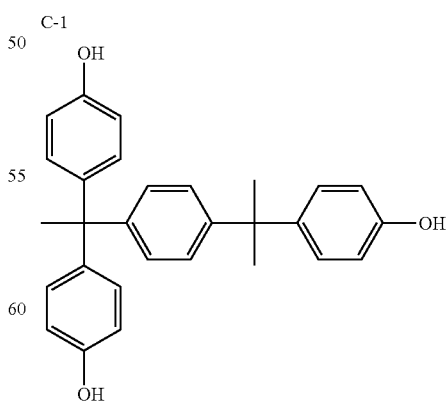

The evaluation results of the compositions of Table 1 are shown in Table 2.

TABLE 2

| Example | Optimum exposure dose (mJ/cm$^2$) | Residual film ratio (%) | In-plane uniformity of film thickness after development | In-plane uniformity of film thickness after curing |
| --- | --- | --- | --- | --- |
| Example 1 | 340 | 99 | A | A |
| Example 2 | 380 | 99 | A | A |
| Example 3 | 360 | 97 | A | A |
| Example 4 | 340 | 95 | A | A |
| Example 5 | 400 | 96 | A | A |
| Example 6 | 320 | 95 | A | A |
| Comparative Example 1 | 800 | 98 | C | C |
| Comparative Example 2 | 800 | 100 | C | C |

The results of Table 2 indicate that the photosensitive resin composition of the invention has been remarkably improved in balance of performances of sensitivity, residual film ratio, and film thickness uniformity.

A photosensitive resin composition of the present invention can manufacture a relief structure which is excellent in heat resistance, mechanical characteristics, electrical characteristics, and chemical resistance based on a PBO resin, while reducing the problems of the film loss during development, and the coloration during thermosetting. It can be preferably used for semiconductor uses, particularly as a buffer coat.

The entire disclosure of each and every foreign patent application from which the benefit of foreign priority has been claimed in the present application is incorporated herein by reference, as if fully set forth.

What is claimed is:

1. A photosensitive resin composition comprising:
    a polybenzoxazole precursor (A);
    a naphthoquinone diazide photosensitizer (B); and
    a phenolic hydroxyl group-containing compound (C) represented by general formula (I):

wherein $R_1$ to $R_6$ each independently represents a hydrogen atom, a hydroxyl group, an alkyl group, a cyclic alkyl group, an aryl group, an aralkyl group, an alkoxy group, a halogen atom, an acyl group, an acyloxy group, an alkoxycarbonyl group or an alkenyl group;
    $R_7$ to $R_{12}$ each independently represents an alkyl group, a cyclic alkyl group, an aryl group, an aralkyl group, an alkoxy group, a halogen atom, an acyl group, an acyloxy group, an alkoxycarbonyl group, or an alkenyl group;
    a plurality of $R_1$ to $R_{12}$ may be each independently different groups;
    a, c, e, g, i, and k each independently represents an integer of 0 to 5, and at least one of them is 1 or more; and
    b, d, f, h, j, and l each independently represents an integer of 0 to 4, and satisfy a+b≦5, c+d≦5, e+f≦5, g+h≦5, i+j≦5, and k+l≦5.

2. The photosensitive resin composition according to claim 1,
    wherein the naphthoquinone diazide photosensitizer (B) comprises two or more kinds of naphthoquinone diazide photosensitizers.

3. A method for manufacturing a semiconductor apparatus, comprising:
    coating the photosensitive resin composition according to claim 1 on a semiconductor element;
    prebaking the coated photosensitive resin composition;
    exposing the prebaked photosensitive resin composition;
    developing the exposed photosensitive resin composition; and
    heating the developed photosensitive resin composition so as to obtain the semiconductor apparatus.

* * * * *